US012616055B2

(12) United States Patent
Kim et al.

(10) Patent No.: US 12,616,055 B2
(45) Date of Patent: Apr. 28, 2026

(54) SEMICONDUCTOR DEVICE AND METHOD FOR MAKING THE SAME

(71) Applicant: STATS ChipPAC Pte. Ltd, Singapore (SG)

(72) Inventors: YoungSang Kim, Gyeonggi-do (KR); JiEun Kwon, Incheon (KR); JiSik Moon, Incheon (KR)

( * ) Notice: Subject to any disclaimer, the term of this patent is extended or adjusted under 35 U.S.C. 154(b) by 542 days.

(21) Appl. No.: 18/154,024

(22) Filed: Jan. 12, 2023

(65) Prior Publication Data

US 2023/0230856 A1 Jul. 20, 2023

(30) Foreign Application Priority Data

Jan. 14, 2022 (CN) .......................... 202210041709.0

(51) Int. Cl.
| | |
|---|---|
| *H01L 21/56* | (2006.01) |
| *H01L 21/48* | (2006.01) |
| *H01L 23/31* | (2006.01) |
| *H01L 23/498* | (2006.01) |
| *H01L 23/552* | (2006.01) |

(52) U.S. Cl.
CPC ........ *H01L 21/565* (2013.01); *H01L 21/4853* (2013.01); *H01L 23/3128* (2013.01); *H01L 23/49816* (2013.01); *H01L 23/49838* (2013.01); *H01L 23/552* (2013.01)

(58) Field of Classification Search
None
See application file for complete search history.

(56) References Cited

U.S. PATENT DOCUMENTS

| | | | |
|---|---|---|---|
| 8,648,469 B2 | 2/2014 | Choi et al. | |
| 10,872,879 B2 | 12/2020 | Kim et al. | |
| 2009/0302439 A1 | 12/2009 | Pagaila et al. | |
| 2016/0225745 A1 | 8/2016 | Beer et al. | |
| 2019/0051625 A1 | 2/2019 | Hsu et al. | |
| 2019/0096815 A1* | 3/2019 | Belonio, Jr. | ........ H01L 21/4853 |
| 2019/0393140 A1* | 12/2019 | Yeh | ......................... H01L 25/16 |
| 2021/0151386 A1 | 5/2021 | Yang et al. | |
| 2021/0217725 A1 | 7/2021 | Kim et al. | |

* cited by examiner

*Primary Examiner* — Jay C Chang
(74) *Attorney, Agent, or Firm* — Junhe Law Office, P.C.; Yi Zhang

(57) ABSTRACT

A method for making a semiconductor device is provided. The method includes: providing a package including: a substrate including a first surface and a second surface opposite to the first surface; a first electronic component mounted on the first surface of the substrate; a second electronic component mounted on the second surface; and a contact pad formed on the second surface of the substrate, wherein the contact pad is outside of a projection of the second electronic component on the second surface of the substrate; and a first encapsulant disposed on the first surface of the substrate and covering the first electronic component; forming a second encapsulant over and around the second electronic component, wherein the contact pad is exposed from the second encapsulant; planarizing the second encapsulant to expose the second electronic component; and forming a bump on the contact pad of the second surface of the substrate.

9 Claims, 15 Drawing Sheets

SEMICONDUCTOR DEVICE AND METHOD FOR MAKING THE SAME

TECHNICAL FIELD

The present application generally relates to semiconductor devices, and more particularly, to a semiconductor package and a method for making the same.

BACKGROUND OF THE INVENTION

The semiconductor industry is constantly faced with complex integration challenges as consumers want their electronics to be smaller, faster and higher performance with more and more functionality packed into a single device. One of the solutions is System-in-Package (SiP). SiP is a functional electronic system or sub-system that includes two or more heterogeneous semiconductor dice, such as a logic chip, a memory, integrated passive devices (IPD), RF filters, sensors, heat sinks, or antennas. Recently, SiP uses Double Side Molding (DSM) technology to further shrink the overall package size. However, the conventional DSM technology is complex, resulting in excess cost and low reliability.

Therefore, a need exists for a simpler and more cost effective double-sided molding process.

SUMMARY OF THE INVENTION

An objective of the present application is to provide a method for making a semiconductor device with reduced processes.

According to an aspect of embodiments of the present application, a method for making a semiconductor device. The method may include: providing a package comprising a substrate, wherein the substrate comprises a first surface and a second surface opposite to the first surface; a first electronic component mounted on the first surface of the substrate; a second electronic component mounted on the second surface of the substrate; and a contact pad formed on the second surface of the substrate, wherein the contact pad is outside of a projection of the second electronic component on the second surface of the substrate; and a first encapsulant disposed on the first surface of the substrate and covering the first electronic component; forming a second encapsulant over and around the second electronic component, wherein the contact pad is exposed from the second encapsulant; planarizing the second encapsulant to expose the second electronic component; and forming a bump on the contact pad of the second surface of the substrate.

According to an aspect of embodiments of the present application, a method for making a semiconductor device. The method may comprise: providing a package comprising: a substrate comprising a first surface and a second surface opposite to the first surface; an electronic component mounted on the first surface of the substrate; and a contact pad formed on the first surface of the substrate, wherein the contact pad is outside of a projection of the electronic component on the first surface of the substrate; forming an encapsulant over and around the electronic component, wherein the contact pad is exposed from the encapsulant; planarizing the encapsulant to expose the electronic component; and forming a bump on the contact pad of the first surface of the substrate.

According to another aspect of embodiments of the present application, a semiconductor device is provided. The device may comprise: a substrate comprising a first surface and a second surface opposite to the first surface; a first electronic component mounted on the first surface of the substrate; a first encapsulant disposed on the first surface of the substrate and covering the first electronic component; a second electronic component mounted on the second surface of the substrate; a bump formed on the second surface of the substrate, wherein the bump is outside of a projection of the second electronic component on the second surface of the substrate; and a second encapsulant disposed on the second surface of the substrate, wherein the second encapsulant surrounds the second electronic component but does not surround the bump.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one sub-unit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
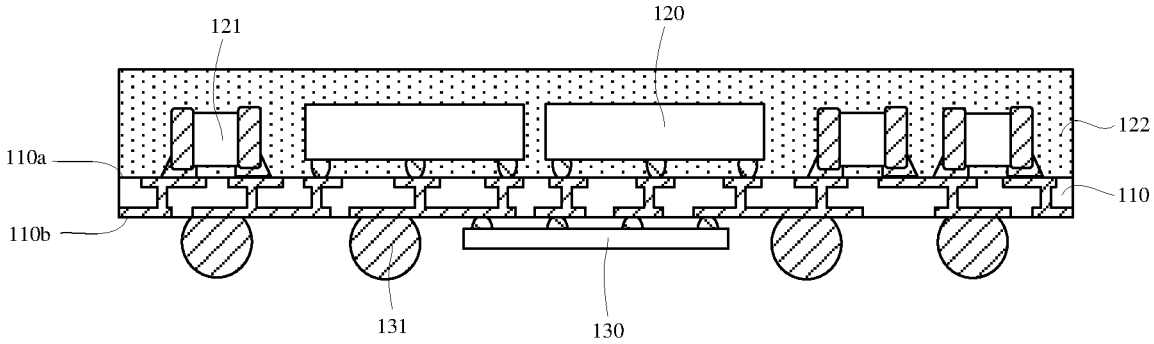
FIGS. 1A to 1D are cross-sectional views illustrating a double-sided molding process for forming a system-in-package (SIP) device.
Figure 1B:
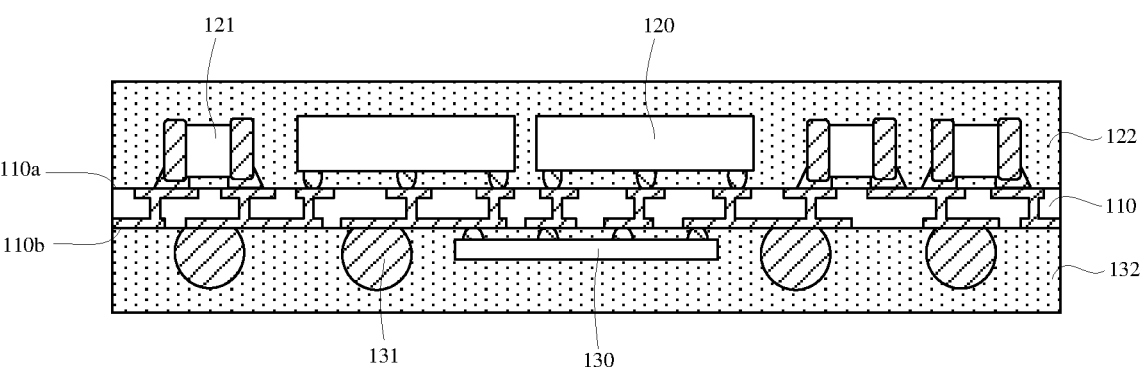
Figure 1C:
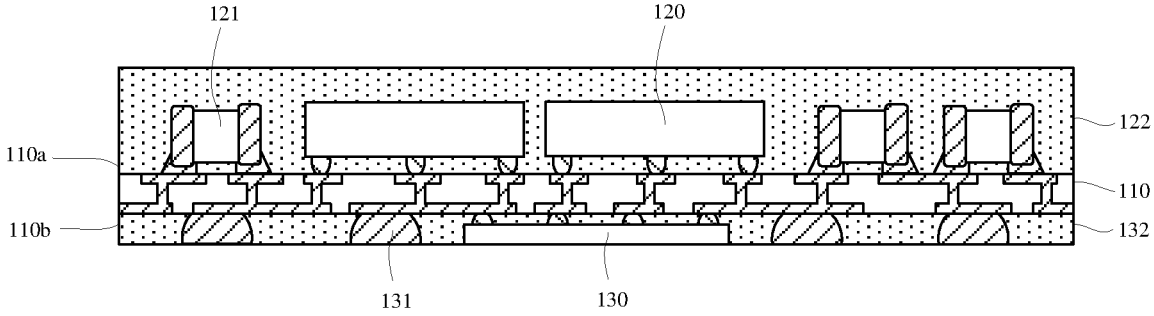
Figure 1D:
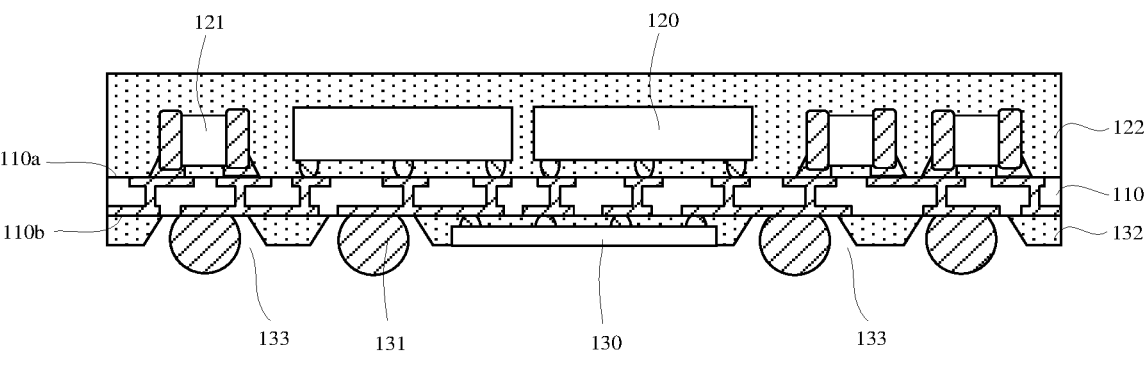

FIGS. 1A-1D illustrate a double-sided molding process for forming a system-in-package (SIP) device. FIG. 1A shows a cross-sectional view of a substrate 110 with a plurality of semiconductor dice 120 and discrete devices 121 mounted on its top surface 110a, which are covered by a first encapsulant 122. As illustrated in FIG. 1A, a semiconductor die 130 and a plurality of bumps 131 are disposed on the bottom surface 110b of the substrate 110. Then, as shown in FIG. 1B, the bottom surface 110b of the substrate 110 is over molded with a second encapsulant 132. That is, the second encapsulant 132 covers all the semiconductor die 130 and the plurality of bumps 131. As shown in FIG. 1C, a grinding operation is performed to reduce a thickness of the second encapsulant 132 and expose the semiconductor die 130. After the grinding operation, the plurality of bumps 131 and semiconductor die 130 are at the same level over the substrate 110. Afterwards, as shown in FIG. 1D, a laser ablation operation is performed to remove some sections of the second encapsulant 132 to form vias 133 in the second encapsulant 132. The vias 133 expose interconnect portions of the plurality of bumps 131. Then, a cleaning operation is performed to remove particles or contaminations generated in the grinding and ablation operations. In some cases, the plurality of bumps 131 may be reflowed to protrude from the bottom surface of the second encapsulant 132.

As can be seen, in the process shown in FIGS. 1A-1D, both the top surface 110a and bottom surface 110b of the substrate 110 are over molded. However, additional operations such as laser ablation and via cleaning are needed to expose the bumps 131 from the second encapsulant 132 formed on the bottom surface 110b of the substrate 110, which may result in die cracks and visual defects in the semiconductor package, and may cause a worse surface condition as the bumps 131 (i.e., metal) is grinded together with the second encapsulant 132 (i.e., resin).

To address the above problems, in embodiments of the present application, the semiconductor die is first mounted the second surface of the substrate, and then the bottom surface of the substrate is only partially molded to cover the semiconductor die. Afterwards, the bumps can be formed on unmolded regions of the second surface. As such, there is no need to perform laser ablation and via cleaning operations in embodiments of the present application, and thus the process cycle time can be reduced and the condition of the second surface can be improved.

Figure 2:
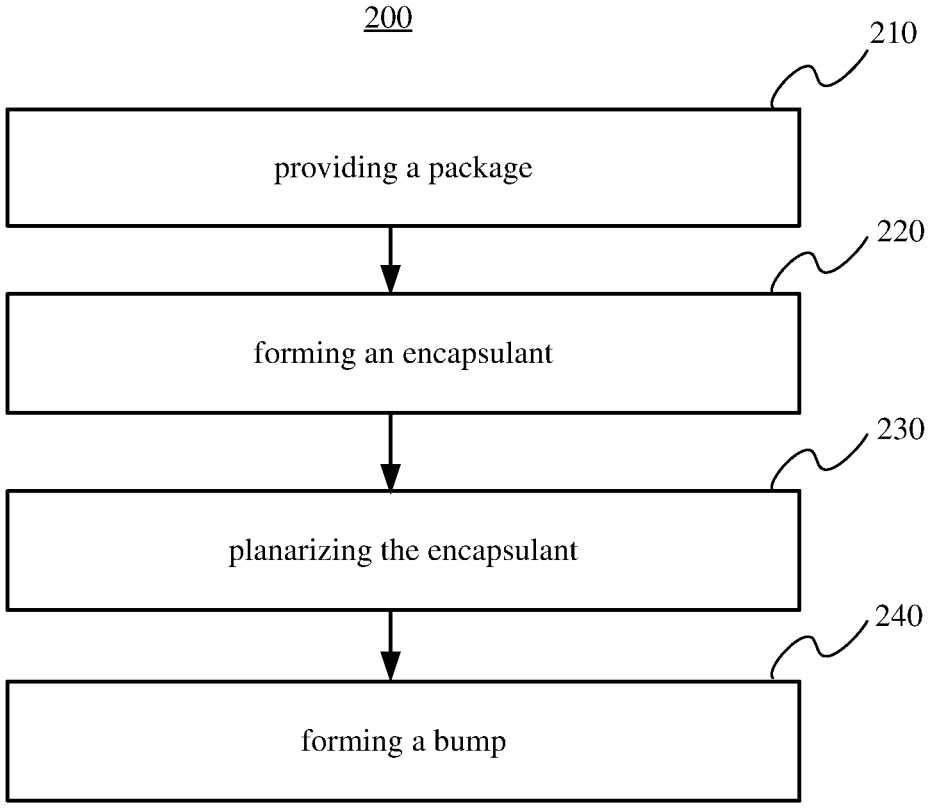
FIG. 2 is a flowchart illustrating a method for making a semiconductor device according to an embodiment of the present application.

Referring to FIG. 2, a flowchart illustrating a method 200 for making a semiconductor device is illustrated according to an embodiment of the present application. As illustrated in FIG. 2, the method 200 may start with providing a package in block 210. In some embodiments, the package may be an integrated circuit package, with some package materials enclosing one or more semiconductor dice, for example. In block 220, an encapsulant can be formed, which may be planarized in a block 230. Afterwards, in block 240 a bump may be formed.

Referring to FIGS. 3A to 3D, cross-sectional views illustrating various blocks of the method for making a semiconductor device are illustrated. In the following, the method 200 of FIG. 2 will be described with references to FIGS. 3A to 3D in more details.

Figure 3A:
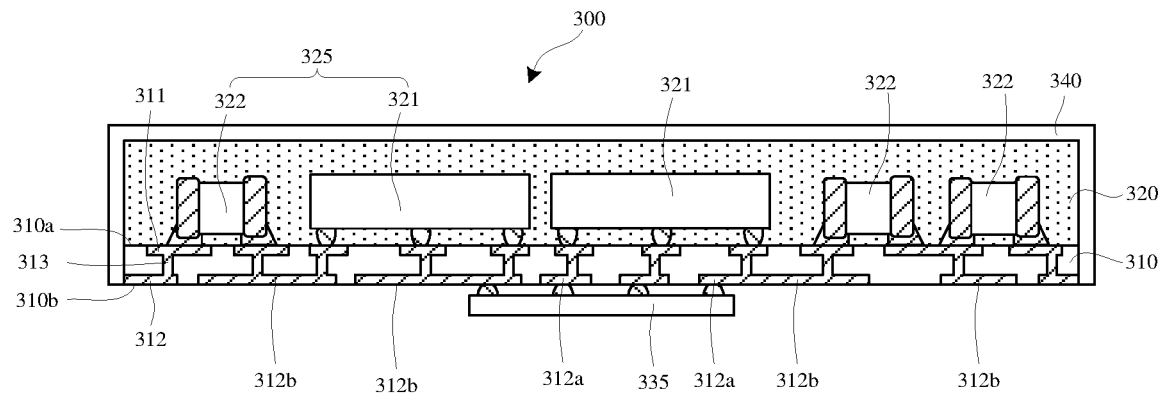
FIGS. 3A to 3D are cross-sectional views illustrating various steps of the method for making a semiconductor device illustrated in FIG. 2 according to an embodiment of the present application.

As illustrated in FIG. 3A, a package 300 is provided. The package 300 may include a substrate 310, a first electronic component 325, a second electronic component 335 and a first encapsulant 320 which at least partially encloses the first electronic component 325.

In particular, the substrate 310 has a first surface 310a and a second surface 310b opposite to the first surface 310a. In some embodiments, the substrate 310 may include a redistribution structure (RDS) having one or more dielectric layers and one or more conductive layers between and through the dielectric layers. The conductive layers may define pads, traces and plugs through which electrical signals or voltages can be distributed horizontally and vertically across the RDS. As shown in the example of FIG. 3A, the RDS may include a plurality of first conductive patterns 311 formed on the first surface 310a and a plurality of second conductive patterns 312 formed on the second surface 310b. In addition, the RDS may further include a plurality of conductive vias 313 electrically connecting at least one of the first conductive patterns 311 formed on the first surface 310a with at least one of the second conductive patterns 312 formed on the second surface 310b. In a case where the substrate 310 is a single layer, the conductive vias 313 may be configured to penetrate between the first surface 310a and the second surface 310b to directly connect the first conductive patterns 311 with the second conductive patterns 312. In a case where the substrate 310 has multiple layers, the conductive vias 313 may be configured to partially penetrate between the first surface 310a and the second surface 310b to connect the first conductive patterns 311 and the second conductive patterns 312 using additional wire patterns formed within the substrate 310. It could be appreciated that, the first conductive patterns 311, the second conductive patterns 312 and the conductive vias 313 may be implemented in various structures and types, but aspects of the present application are not limited thereto.

The first electronic component 325 is mounted on the first surface 310a of the substrate 310 and is electrically connected to the first conductive patterns 311. In the example of FIG. 3A, the first electronic component 325 may include semiconductor dice 321 and discrete devices 322. In FIG. 3A, the semiconductor dice 321 are formed in a flip chip type and may be mounted such that conductive bumps of the semiconductor dice 321 are welded to some of the first conductive patterns 311 of the substrate 310. In other embodiments, the semiconductor dice 321 may include bond pads and may be connected to the first conductive patterns 311 by wire bonding. The present application does not limit the connection relationship between the semiconductor dice 321 and the first conductive patterns 311 to that disclosed herein.

The first encapsulant 320 is disposed on the first surface 310a of the substrate 310 and covers the first electronic component 325. The first encapsulant 320 may be made of a general molding compound resin, for example, an epoxy-based resin, but the scope of this application is not limited thereto. The first encapsulant 320 may protect the first electronic component 325 from external circumstances.

The second electronic component 335 is mounted on the second surface 310b of the substrate 310 and is electrically connected to the second conductive patterns 312. In the example of FIG. 3A, the second electronic component 335 is shown as a semiconductor die. In other embodiments, the second electronic component 335 may include a plurality of semiconductor dice or may further include one or more discrete devices, but aspects of the present application are not limited thereto. The second electronic component 335 is attached to parts of the plurality of second conductive patterns 312a, while exposes other parts of the plurality of second conductive patterns 312b. These other parts of the plurality of second conductive patterns 312b exposed from the second electronic component 335 ensure that the electronic connections to the first electronic component 325 are available, which may be subsequently connected with a bump, and are referred to as contact pads hereinafter.

In the example shown in FIG. 3A, the package 300 further includes an electromagnetic interference (EMI) shielding layer 340. The EMI shielding layer 340 may be made of a conductive material and may be electrically connected to a ground of the semiconductor package or an external ground. The EMI shielding layer 340 may shield EMI induced to (or generated by) the semiconductor package.

Figure 3B:
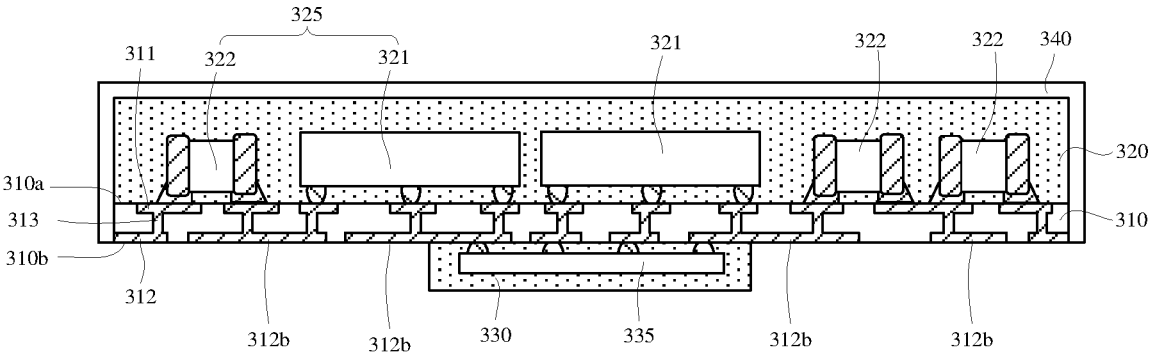

As illustrated in FIG. 3B, a second encapsulant 330 is formed over and around the second electronic component 335.

The second encapsulant 330 is disposed on the second surface 310b of the substrate 310, and covers the second electronic component 335. However, at least some of the contact pads 312b are exposed from the second encapsulant 330, i.e. not covered by the second encapsulant 330. In this way, further conductive materials can be connected to the exposed contact pads 312b, as described below. The second encapsulant 330 may be made of a general molding compound resin, for example, an epoxy-based resin, but the scope of this application is not limited thereto. In some embodiments, the second encapsulant 330 may be the same material as the first encapsulant 320. Similarly, the second encapsulant 330 may protect the second electronic component 335 from external circumstances and subsequent processes for forming the bump on the contact pads 312b.

Figure 3C:
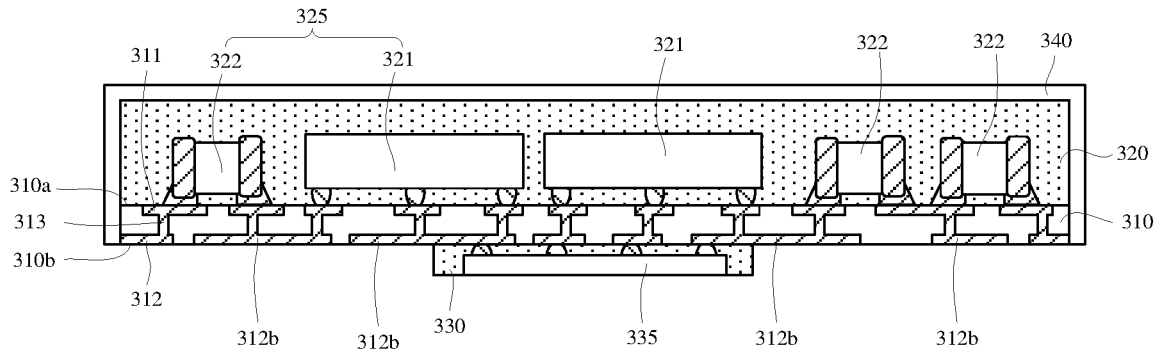

Afterwards, as illustrated in FIG. 3C, the second encapsulant 330 is planarized to expose the second electronic component 335. In some embodiments, a backgrinding operation with grinder, or another suitable chemical or mechanical grinding or etching process, can be used to reduce a thickness of the second encapsulant 330 and expose the second electronic component 335. The planarization may result in that a surface of the second encapsulant 330 is coplanar with a surface of the second electronic component 335 by removing portions of the second encapsulant 330, in another word, a sidewall is formed around the second electronic component 335, as shown in FIG. 3C.

Figure 3D:
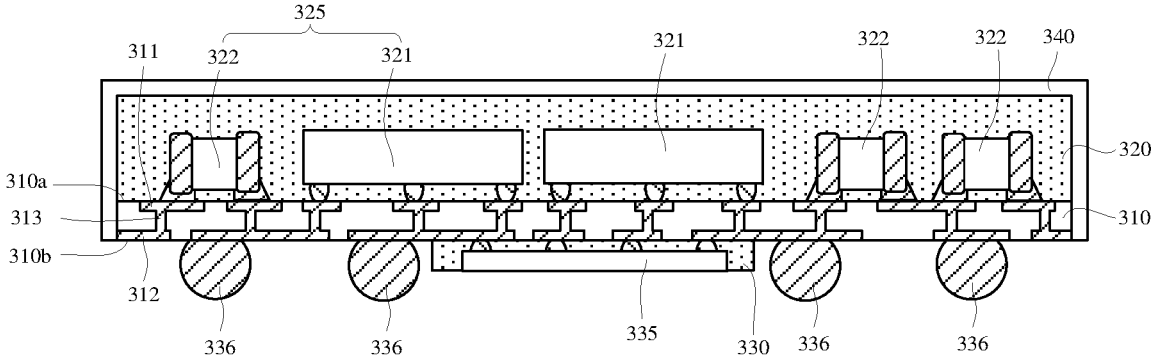

As illustrated in FIG. 3D, a plurality of bumps 336 are formed on the second surface 310b of the substrate 310.

In some embodiments, an electrically conductive bump material is deposited over the contact pads 312 on the second surface 310b of the substrate 310 using one of or any combination of the following processes: evaporation, electrolytic plating, electroless plating, ball drop, or screen printing process. The conductive bump material can be Al, Sn, Ni, Au, Ag, lead (Pb), bismuth (Bi), Cu, solder, or combinations thereof, with an optional flux solution. For example, the bump material can be eutectic Sn/Pb, high-lead solder, or lead-free solder.

The bump material may be bonded to the contact pads 312 using a suitable attachment or bonding process. In an embodiment, the bump material may be reflowed by heating the material above its melting point to form conductive balls or bumps 336. In some applications, the bumps 336 can also be compression bonded or thermocompression bonded to the contact pads 312. The spherical bumps 336 shown in FIG. 3D may represent one type of interconnect structure that can be formed over the second conductive patterns 312. In other examples, the bumps 336 may be a stud bump, a micro bump, or other electrical interconnects.

FIGS. 4A-4H illustrate a process for making a package according to an embodiment of the present application. The package may be the same as or similar to the package 300 of FIG. 3A. It can be appreciated that packages with similar topography can be formed using this process.

Figure 4A:
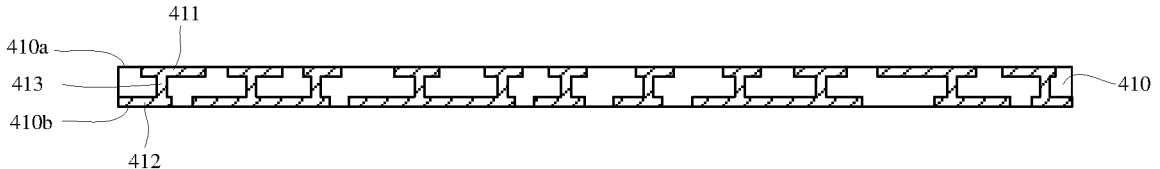
FIGS. 4A to 4H are cross-sectional views illustrating various steps of making the package shown in FIG. 3A according to an embodiment of the present application.

In particular, the process starts with providing a package substrate 410 as illustrated in FIG. 4A. The substrate 410 can be a laminate interposer, PCB, wafer-form, strip interposer, leadframe, or another suitable substrate. The substrate 410 may include one or more insulating or passivation layers, one or more conductive vias formed through the insulating layers, and one or more conductive layers formed over or between the insulating layers. The substrate 410 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, and other reinforcement fibers or fabrics. The insulating layers may contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The substrate 410 can also be a multi-layer flexible laminate, ceramic, copper clad laminate, glass, or semiconductor wafer including an active surface containing one or more transistors, diodes, and other circuit elements to implement analog circuits or digital circuits. The substrate 410 may include one or more electrically conductive layers or redistribution layers (RDL) formed using sputtering, electrolytic plating, electroless plating, or other suitable deposition process. The conductive layers may be one or more layers of Al, Cu, Sn, Ni, Au, Ag, titanium (Ti), tungsten (W), or other suitable electrically conductive material.

In the example shown in FIG. 4A, only one insulating layer is illustrated as a core substrate, a plurality of first conductive patterns 411 are formed on the first surface 410a of the substrate 410, and a plurality of second conductive patterns 412 are formed on the second surface 410b of the substrate 410. At least one of the plurality of first conductive patterns 411 and at least one of the plurality of second conductive patterns 412 are electrically connected respectively by a plurality of conductive vias 413 formed in the insulating layer. In some alternative embodiments, additional insulating layers and/or conductive layers may be formed over the structure shown in FIG. 4A to implement more advanced signal routing.

Figure 4B:
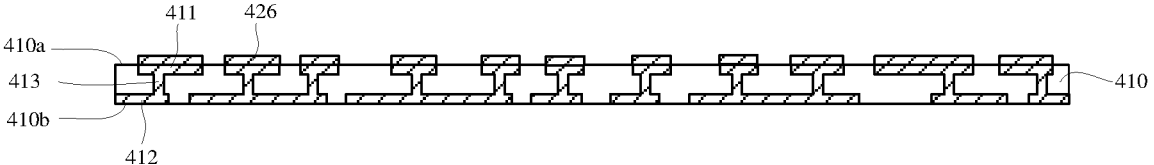

As shown in FIG. 4B, solder paste 426 may be deposited or printed onto the first conductive patterns 411 at locations where devices are to be surface mounted onto the top surface 410a of the substrate 410. The solder paste 426 can be dispensed by jet printing, laser printing, pneumatically, by pin transfer, using a photoresist mask, by stencil-printing, or by another suitable process.

Figure 4C:
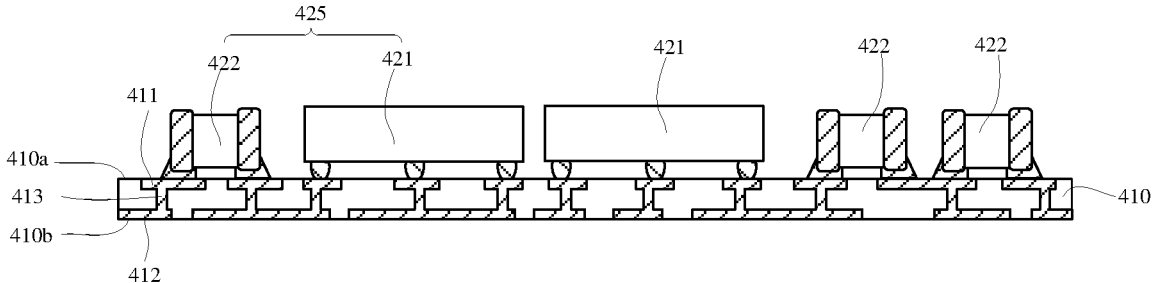

As shown in FIG. 4C, the first electronic component 425 may be disposed over the first surface 410a with terminals of the first electronic component 425 in contact with and over the solder paste 426. The first electronic component 425 may include semiconductor dice 421 and discrete devices 422. The first electronic component 425 may be passive or active devices as desired to implement any given electrical functionality within the semiconductor package being formed. The first electronic component 425 may be active devices such as semiconductor dice, semiconductor packages, discrete transistors, discrete diodes, etc. The first electronic component 425 may also be passive devices such as capacitors, inductors, or resistors. Then, the solder paste 426 may be reflowed to mechanically and electrically couple the first electronic component 425 to the first conductive patterns 411.

Figure 4D:
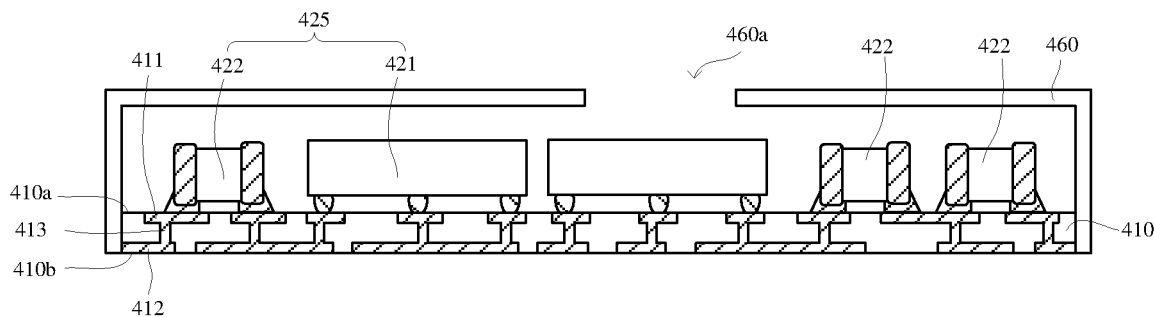

As shown in FIG. 4D, the substrate 410 with the first electronic component 425 is disposed within a mold 460. The mold 460 may include one or more inlet ports 460a formed in its top plate or side plate. The inlet port 460a is used for injection of encapsulant into the mold 460. In some embodiments, the mold 460 may include some openings to allow displaced air to escape from the mold during injection of encapsulant.

Figure 4E:
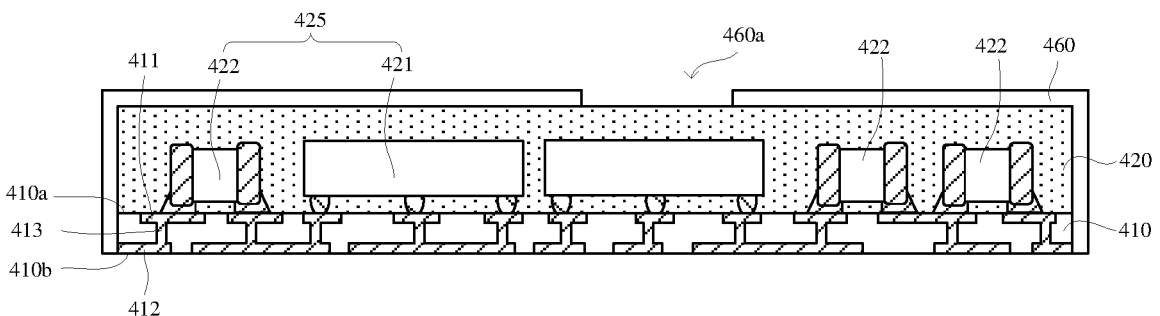

As shown in FIG. 4E, a first encapsulant 420 is injected into the mold 460 through the inlet port 460a. The first encapsulant 420 fully covers the semiconductor dice 421 and the discrete devices 422. The first encapsulant 420 may be polymer composite material, such as epoxy resin with filler, epoxy acrylate with filler, or polymer with proper filler. The first encapsulant 420 may be non-conductive and environmentally protects the semiconductor device from external elements and contaminants. The first encapsulant 420 may also protect the first electronic component 425 from degradation due to exposure to light.

Figure 4F:
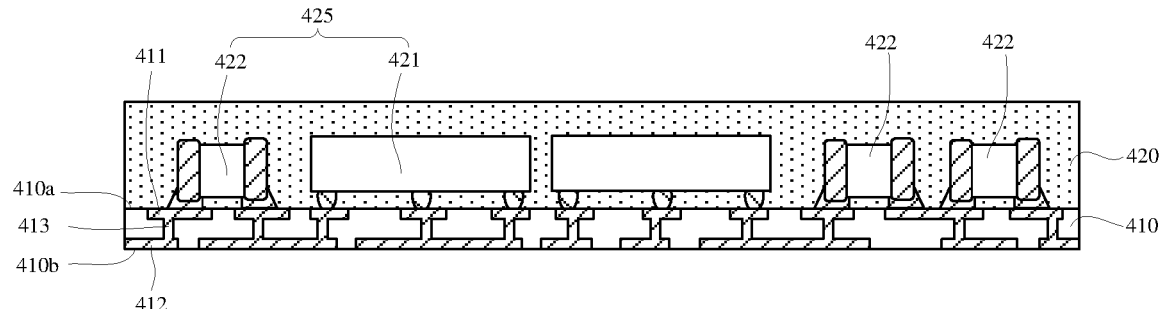

As shown in FIG. 4F, the substrate 410 covered by the first encapsulant 420 is removed from the mold 460. In some examples, the first encapsulant 420 may be planarized after removed from the mold 460, if desired.

Figure 4G:
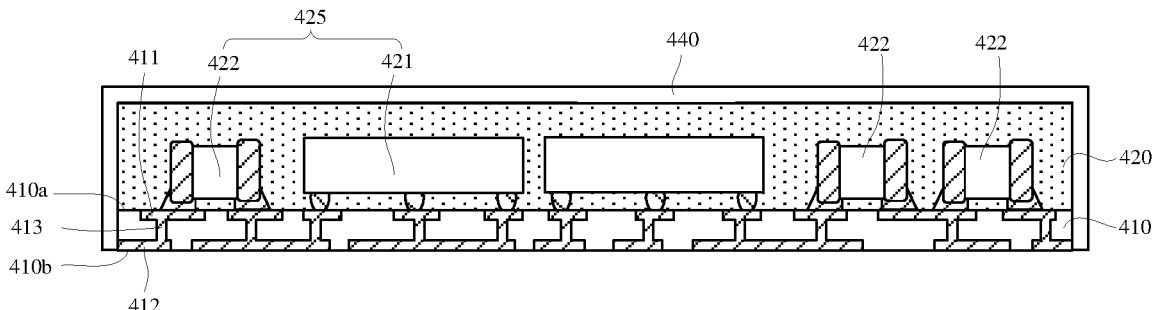

As shown in FIG. 4G, an electromagnetic interference (EMI) shielding layer 440 is formed on the first encapsulant 420 and the side surface of the substrate 410, except for the second surface 410b of the substrate 410. The EMI shielding layer 440 may be formed to a predetermined thickness by plasma deposition or spraying, but aspects of the present application are not limited thereto. In some examples, the EMI shielding layer 440 may be made of a conductive material and may be electrically connected to a ground of the semiconductor package or an external ground. The EMI shielding layer 440 may shield EMI induced to (or generated by) the semiconductor package.

Figure 4H:
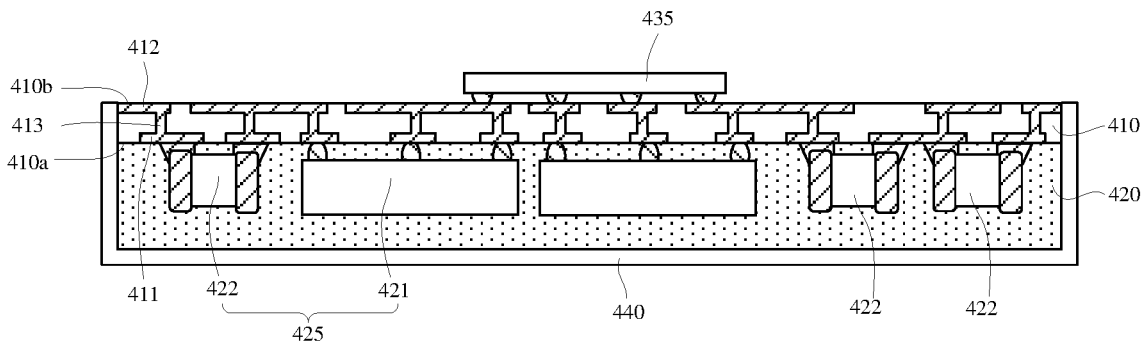

As shown in FIG. 4H, the substrate 410 is flipped with the second surface 410b oriented upward. Solder paste is patterned onto parts of the second conductive patterns 412 on the second surface 410b of the substrate 410, and a second electronic component 435 is surface mounted on the second surface 410b through the solder paste. In the example of FIG. 4H, the second electronic component 435 is shown as a semiconductor die. In some other embodiments, a plurality of semiconductor dice or one or more discrete devices can be surface mounted on the second surface 410b through the solder paste.

While the process for making the package same or similar to the package 300 of FIG. 3A is illustrated in conjunction with FIGS. 4A-4H, it will be appreciated by those skilled in the art that modifications and adaptations to the process may be made without departing from the scope of the present invention.

Figure 5A:
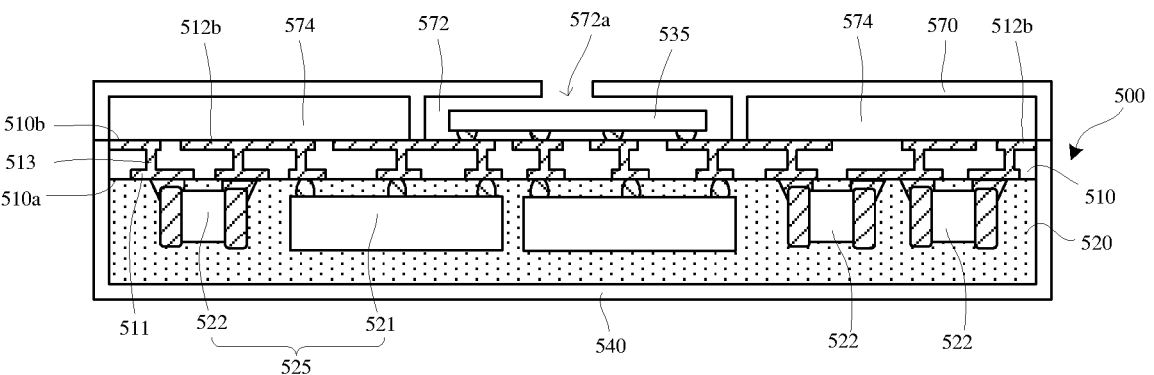
FIGS. 5A to 5C are cross-sectional views illustrating various steps of making a package according to an embodiment of the present application.
Figure 5B:
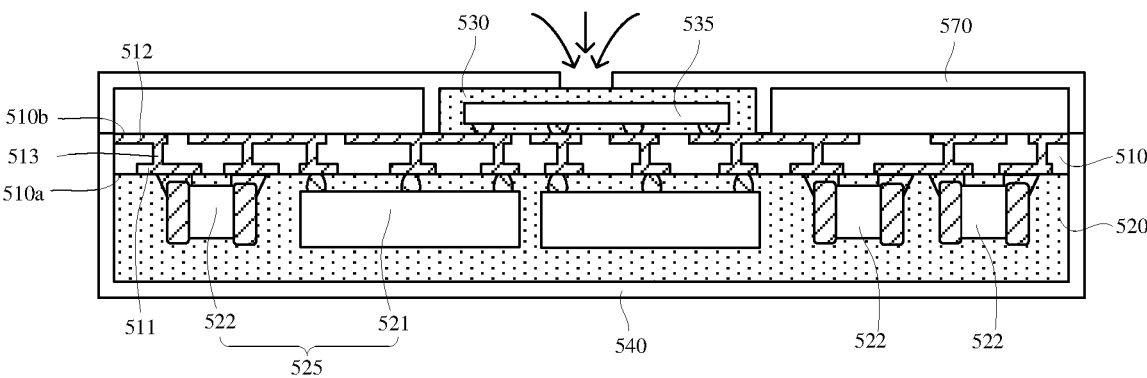
Figure 5C:
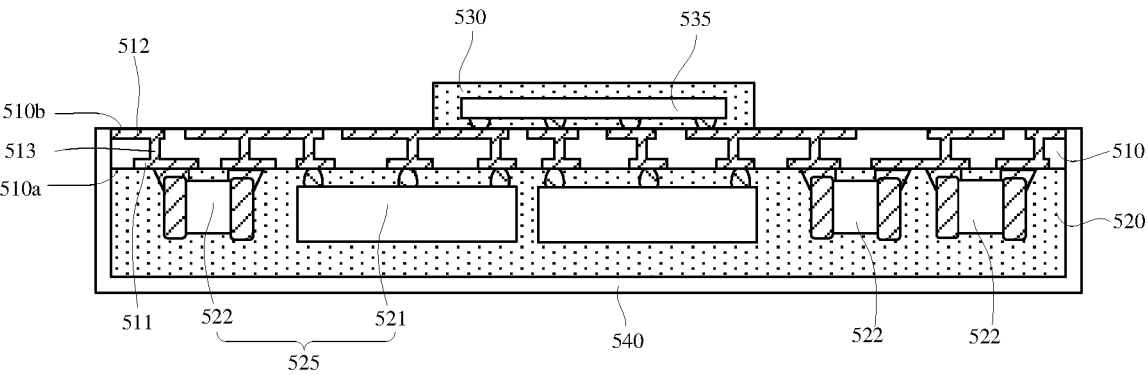

FIGS. 5A-5C illustrate details of a process for forming a package according to an embodiment of the present application.

As shown in FIG. 5A, a package 500 is provided. The package 500 may have the same or similar configuration with the package 300 shown in FIG. 3A, and will not be elaborated herein. As shown in FIG. 5A, the package 500 is flipped with the second surface 510b oriented upward. Then, a mold 570 may be attached to the package 500. The mold 570 may include a first chamber 572, a second chamber 574 and an opening 572a in fluid communication with the first chamber 572. The opening 572a may be located at a wall of the first chamber 572. Then the mold 570 is attached onto the second surface 510b of the substrate 510 with the second electronic component 535 accommodated in the first chamber 572 and the contact pads 512b accommodated in the second chamber 574 of the mold 570. The first chamber 572 has a depth sufficient to accommodate the second electronic component 535 when the mold 570 is mounted onto the second surface 510b of the substrate 510. For example, the first chamber 572 may has a depth greater than a height of the second electronic component 535. Since the opening 572a is in communication with the first chamber 572, it allows for injection of encapsulant into the first chamber 572 of the mold 570 through the opening 572a. Different from the first chamber 572, there is no opening formed at the wall of the second chamber 574. In some embodiments, the mold 570 may include some additional openings in the first chamber 572, so as to allow displaced air to escape the mold during injection of encapsulant.

In FIG. 5B, the second encapsulant 530 is injected into the first chamber 572 of the mold 570 through the opening 572a. The second encapsulant 530 may fully cover the second electronic component 535 and cover the portion of the second surface 510b which is within the first chamber 572. The second encapsulant 530 may be a polymer composite material, such as epoxy resin with filler, epoxy acrylate with filler, or polymer with proper filler. The second encapsulant 530 may be non-conductive and environmentally protects the semiconductor device from external elements and contaminants. The second encapsulant 530 may also protect the second electronic component 535 from degradation due to exposure to light. It can be seen that the second chamber 574 may not be filled with the second encapsulant 530 since there is no opening that permits fluid communication between the second chamber 574 and the external environment.

Afterward, as shown in FIG. 5C, the mold 570 is removed from the second surface 510b of the substrate 510. In this way, the portion of the second surface 510b which is within the second chamber 574 can be clear of undesired coverage of the second encapsulant 530, and other additional structures such as bumps can be connected to the contact pads on the portion of the second surfaced 510b that is not covered by the second electronic component 535.

Figure 6A:
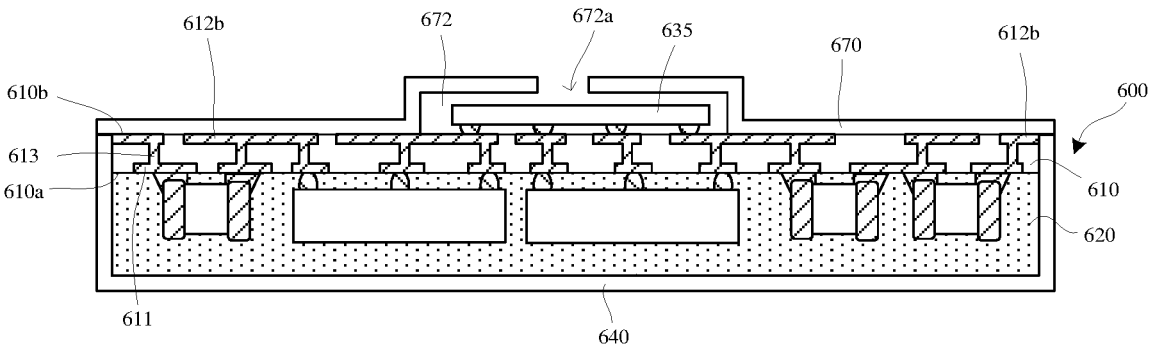
FIGS. 6A and 6B are cross-sectional views illustrating various steps of making a package according to another embodiment of the present application.
Figure 6B:
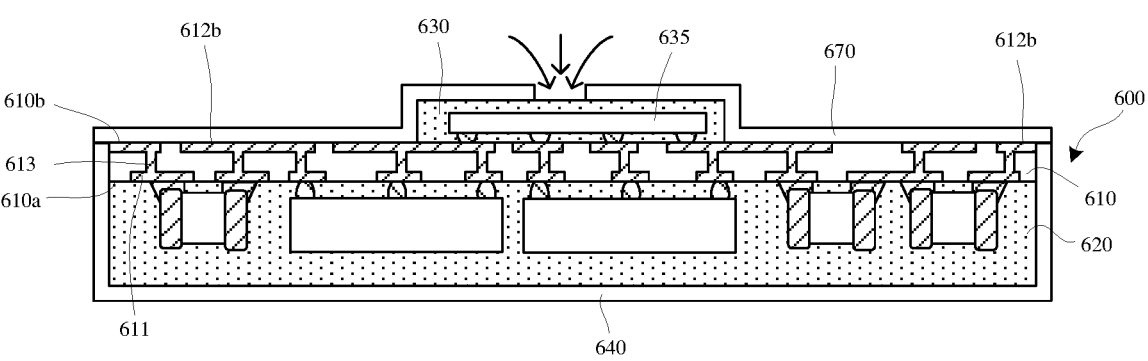

FIGS. 6A-6B illustrate another process for forming a package according to an embodiment of the present application.

As shown in FIG. 6A, a package 600 is provided. The package 600 may have the same or similar configuration with the package 300 shown in FIG. 3A, and will not be elaborated herein. The following description will focus on a mold 670, which has a different profile from the mold 570 shown in FIG. 5A. The mold 670 may include a chamber 672 and an opening 672a in fluid communication with the chamber 672. The opening 672a may be formed at a top or side wall of the chamber 672. Afterwards, the mold 670 is attached onto the second surface 610b of the substrate 610 with the second electronic component 635 accommodated in the chamber 672. Unlike the mold 570 shown in FIG. 5A, the mold 670 is Ω-shaped at the chamber 672, and does not include another chamber(s) for accommodating the contact pads 612b. As shown in FIG. 6A, after the mold 670 is attached onto the second surface 610b of the substrate 610, the contact pads 612b is covered by a peripheral plate of the mold 670, with substantially no gap therebetween.

As shown in FIG. 6B, the second encapsulant 630 is injected into the chamber 672 of the mold 670 through the opening 672a. The second encapsulant 630 may fully cover the second electronic component 635 and cover the portion of the second surface 610b which is within the chamber 672. Because the contact pads 612b is covered by the peripheral plate of the mold 670, no encapsulant can be formed above the contact pads 612b. Thus, the contact pads 612b can be subsequently connected with a bump without additional cleaning processes.

Figure 7A:
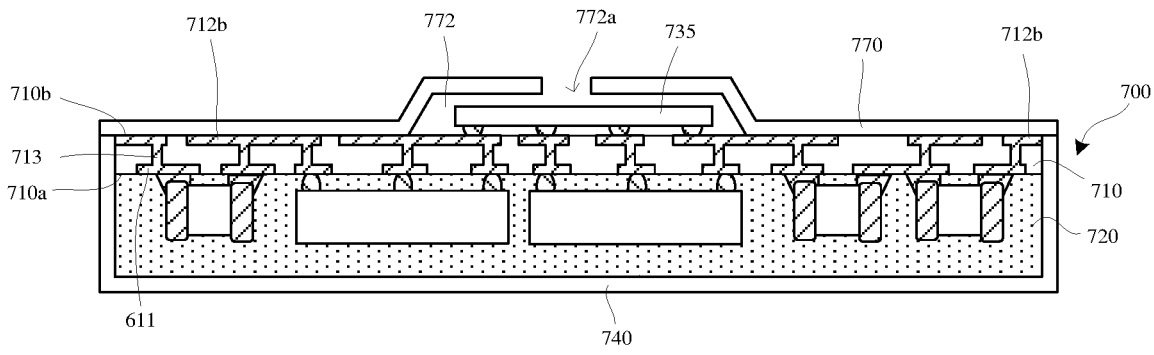
FIGS. 7A and 7B are cross-sectional views illustrating various steps of making a package according to another embodiment of the present application.
Figure 7B:
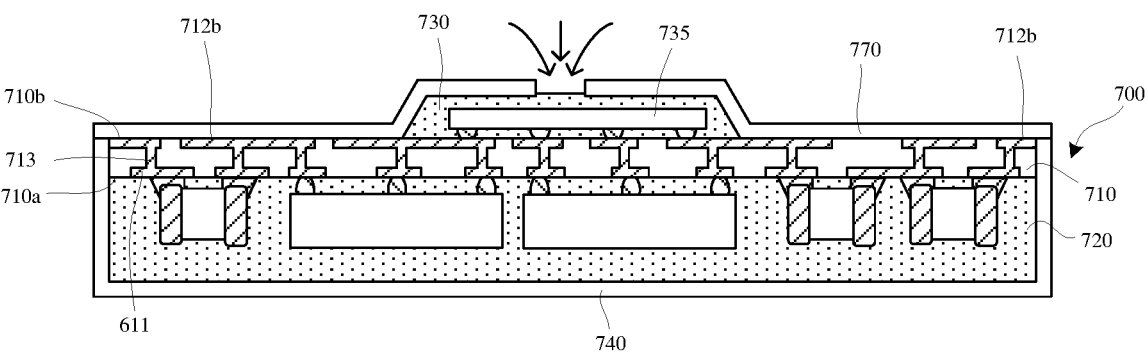

FIGS. 7A-7B illustrate another process for forming a package according to an embodiment of the present application.

As shown in FIG. 7A, a package 700 is provided. The package 700 may have the same or similar configuration with the package 300 shown in FIG. 3A, and will not be elaborated herein. The following description will focus on a mold 770, which has a different feature from the mold 670 shown in FIG. 6A. The chamber 672 of the mold 670 shown in FIG. 6A generally has a rectangular shape, while a chamber 772 defined by the mold 770 shown in FIG. 7A has a trapezoidal shape.

As shown in FIG. 7B, a second encapsulant 730 is injected into the chamber 772 of the mold 770 through the opening 772a. The second encapsulant 730 may maintain the shape of the chamber 772 within the mold 770. That is, the second encapsulant 730 may also have a trapezoidal shape. As the second encapsulant 730 has a bottom area wider than its top area, the second encapsulant 730 can be more firmly attached to the second surface 710b of the substrate 710.

Figure 8A:
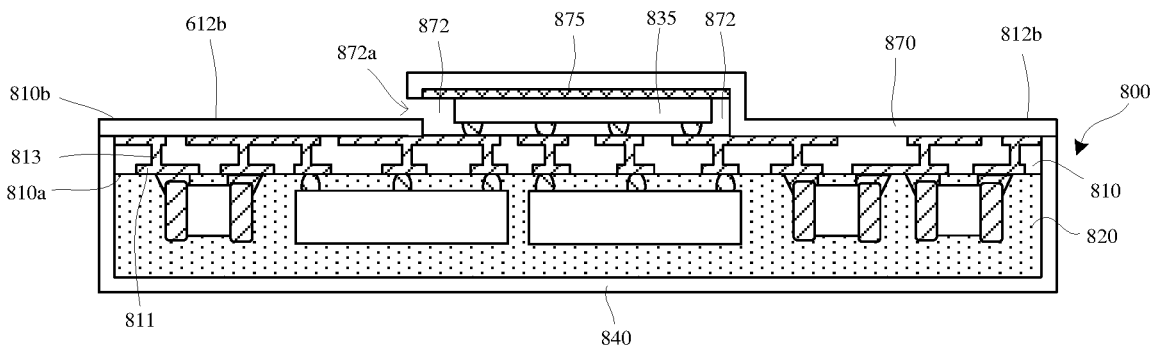
FIGS. 8A to 8C are cross-sectional views illustrating various steps of making a package according to another embodiment of the present application.
Figure 8B:
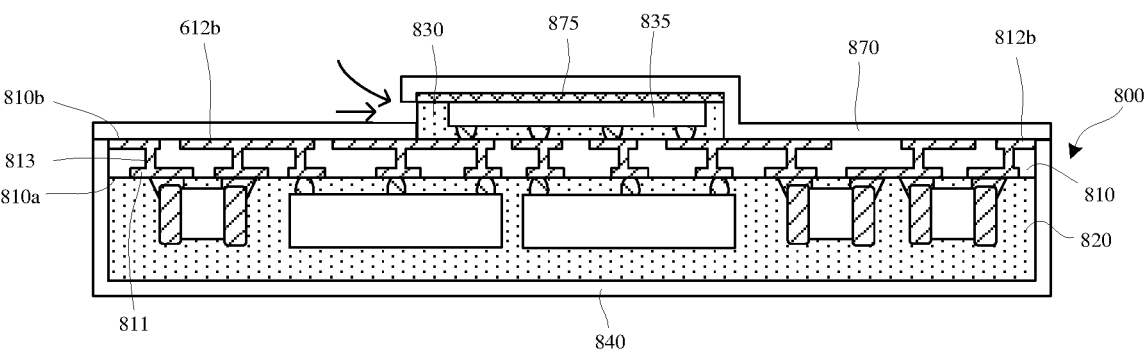
Figure 8C:
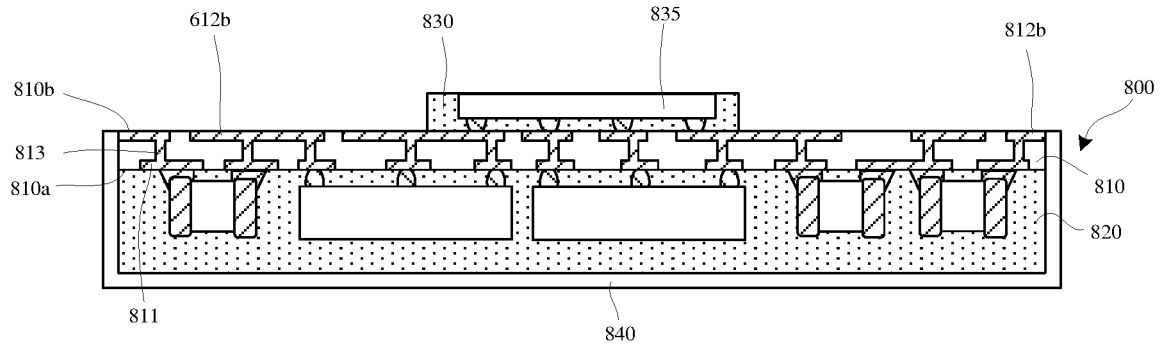

FIGS. 8A-8C illustrate another process for forming a package according to an embodiment of the present application.

As shown in FIG. 8A, a package 800 is provided. The package 800 may have the same or similar configuration with the package 300 shown in FIG. 3A, and will not be elaborated herein. The following description will focus on the mold 870, which is a different profile from the mold 670 shown in FIG. 6A. In the mold 670 shown in FIG. 6A, the chamber 672 has a depth greater than a height of the second electronic component 635. However, in the mold 870 shown in FIG. 8A, the depth of the chamber 872 is generally equal to a height of the second electronic component 835, and the opening 872a is formed on a side wall of the mold 870.

In the example shown in FIG. 8A, a mold film 875 is disposed within the chamber 872 and attached to the top plate of the mold 870. The mold film 875 may be formed of any suitable material with a low elastic modulus, for example, an insulating polymer material. When the mold 870 is attached to the second surface 810b of the substrate 810, the second electronic component 835 can be pressed into mold film 875, and displace a portion of the mold film material. In some other examples, the mold 870 may not include the mold film 875, and the second electronic component 835 may directly contact with the top plate of the mold 870.

As shown in FIG. 8B, a second encapsulant 830 is injected into the chamber 872 of the mold 870 through the opening 872a. Afterwards, as shown in FIG. 8C, the mold 870 is removed from the second surface 810b of the substrate 810. As the top surface of the second electronic component 835 is pressed into mold film 875, the second encapsulant 830 may not be formed on the top surface of the second electronic component 835, but only covers each sidewall of the second electronic component 835. Thus, the top surface of the second encapsulant 830 may be generally coplanar with the top surface of the second electronic component 835. As a result, there is no need to perform additional operations to planarize the second encapsulant 830 to expose the second electronic component 835, and the process for making the semiconductor device can be further simplified.

While the process for forming package same or similar to the package shown in FIG. 3B is schematically illustrated in conjunction with FIGS. 4A-4H, FIGS. 5A-5C, FIGS. 6A-6B, FIGS. 7A-7B and FIGS. 8A-8C, it will be appreciated by those skilled in the art that modifications and adaptations to the process may be made without departing from the scope of the present invention. For example, in an embodiment, either or both of the first encapsulant and the second encapsulant may be formed using a transfer molding process. In the transfer molding process, the substrate is first loaded onto a lower mold with the electronic component to be encapsulated being oriented upward, and then an upper mold may cover the substrate. The lower mold and the upper mold may be constructed that a cavity can be formed between them to accommodate the electronic component to be encapsulated. A mold gate and an air vent are located at two opposite sides of the upper mold (or the lower mold) respectively, and both are in fluid communication with the cavity. Subsequently, a molding compound, which may be pre-heated to melt in a heating chamber, can be injected into the cavity through the mold gate to cover the electronic component. Afterwards, the melted molding compound in the cavity can be cured to form the encapsulant that encloses the electronic component. Similarly, the cavity can be formed only at the region(s) where the electronic component (s) are disposed, rather than where the contact pads are disposed.

Figure 9A:
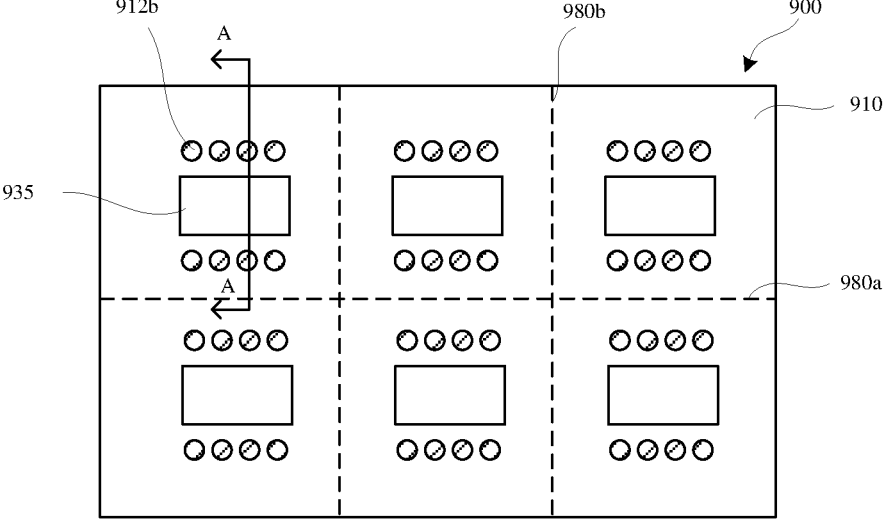
FIGS. 9A and 9B are cross-sectional views illustrating various steps of making an encapsulant with a finger molding process according to an embodiment of the present application.
Figure 9B:
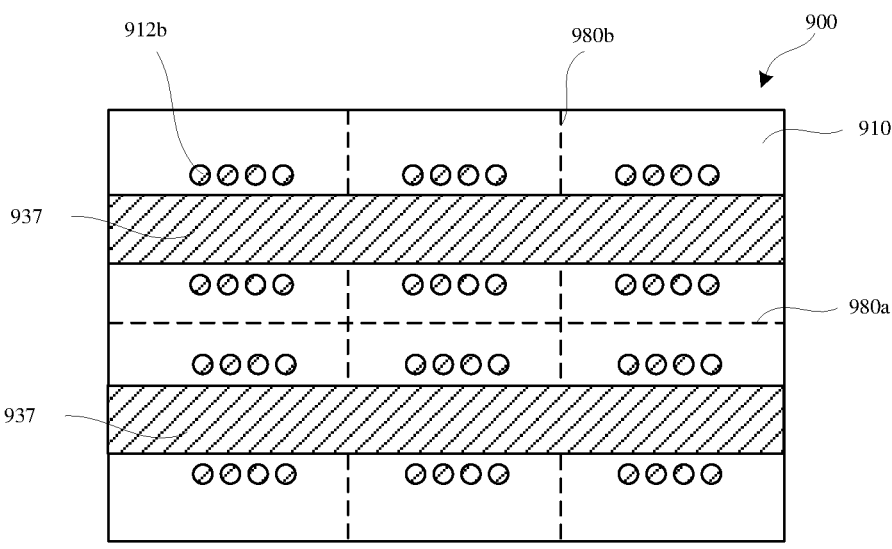

FIGS. 9A and 9B illustrate making an encapsulant with a finger molding process according to an embodiment of the present application. The finger molding process allows for forming respective encapsulants for multiple electronic components simultaneously.

Referring to FIG. 9A, a top view of a substrate plate 900 is shown. The substrate plate 900 includes a plurality of substrates 910 arranged in rows and columns. Each substrate 910 is isolated from its neighboring substrates by horizontal singulation channels 980a and vertical singulation channels 980b. Moreover, an electronic component 935 is mounted on each substrate 910, with a plurality of contact pads 912b formed at both sides of the electronic component 935. A cross-sectional view of the substrate 910 along a section line A-A may be similar to the structure illustrated in FIG. 4H, for example. It could be appreciated that, the layout and number of the substrates 910, the electronic components 935 and the contact pads 912b of the substrate plate 900 shown in FIG. 9A are exemplary only and not mandatory.

Referring to FIG. 9B, two encapsulant strips 937 are molded on the substrates 910, each extending in a horizontal direction of FIG. 9B. The encapsulants strip 937 cover the electronic components 935 but expose the contact pads 912b on each substrate 910.

In an example, the encapsulant strips 937 may be formed by the transfer molding process described above. Specifically, the substrate plate 900 may be first loaded onto a lower mold, and then an upper mold may then be placed to cover the substrate plate 900. The upper mold may include projecting platforms, and finger cavities extending along each row of electronic components 935. After the upper mold covers the substrate plate 900, the electronic components 935 can be accommodated within the finger cavities, while the contact pads 912b are overlaid with the projecting platforms of the upper mold. When the melted molding compound is injected, the finger cavities of the upper mold can be filled up with the molding compound to enclose the electronic components 935. The portions of the contact pads 912b in contact with the platforms of the upper mold remain devoid of, or exposed from, the molding compound after molding. That is, the platforms of the upper mold block the molding compound from flowing onto the portions of the contact pads 912b to be used for further interconnection. Then, the melted molding compound in the finger cavities can be cured to form the encapsulant strips 937. In some examples, conductive bumps may be formed on the contact pads 912b in a similar manner to the bumps 336 in other embodiments of the present application as aforementioned. Afterwards, the substrate plate 900 can be singulated into individual finger molded packages. For example, a saw blade or a laser cutting tool may be used to cut the substrate plate 900 along the horizontal singulation channel 980a and the vertical singulation channel 980b, so as to singulate each substrate 910 from the substrate plate 900.

Figure 10:
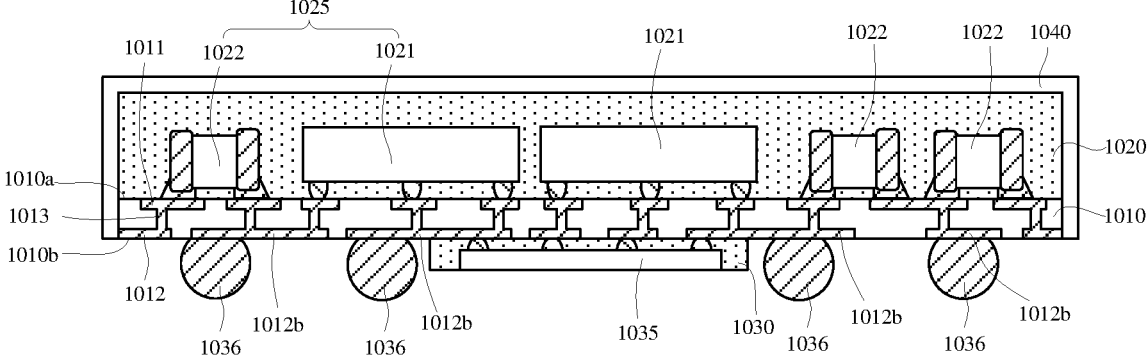
FIG. 10 is a cross-sectional view illustrating a semiconductor device according to an embodiment of the present application.

According to another aspect of the present application, a semiconductor device is provided. Referring to FIG. 10, a cross-sectional view of a semiconductor device 1000 is illustrated according to an embodiment of the present application is illustrated.

As illustrated in FIG. 10, the semiconductor device includes a substrate 1010, a first electronic component 1025, a second electronic component 1035, a first encapsulant 1020, a second encapsulant 1030 and a bump 1036. The substrate 1010 includes a first surface 1010a and a second surface 1010b opposite to the first surface 1010a. The first electronic component 1025 is mounted on the first surface 1010a of the substrate 1010. The first encapsulant 1020 is disposed on the first surface 1010a of the substrate 1010 and covers the first electronic component 1025. The second electronic component 1035 is mounted on the second surface 1010b of the substrate 1010. The bump 1036 is formed on the second surface 1010b of the substrate 1010, and the bump 1036 is outside of a projection of the second electronic component 1020 on the second surface 1010b of the substrate 1010. The second encapsulant 1030 is disposed on the second surface 1010b of the substrate 1010, and the second encapsulant 1030 surrounds the second electronic component 1035 but does not surround the bump 1036.

In some embodiments, the substrate 1010 may include a plurality of first conductive patterns 1011 on the first surface 1010a, a plurality of second conductive patterns 1012 on the second surface 1010b, and one or more conductive vias 1013 within the substrate 1010 for electrically coupling at least one of the plurality of first conductive patterns 1011 with at least one of the plurality of second conductive patterns 1012.

The first electronic component 1025 and the second electronic component 1035 may include a semiconductor die or a discrete device. In an example, the first electronic component 1025 and the second electronic component 1035 may include one or more transistors, and may include a microcontroller device, a radio-frequency (RF) device, a wireless (WiFi, WLAN, etc.) switch, a power amplifier device, a low noise amplifier (LNA) device, etc. In the present example, the first electronic component 1025 and the second electronic component 1035 each includes a semiconductor die having bumps at its surface, and is flip-chip mounted onto the surface of the substrate 1010, such that the bumps contact conductive patterns on the substrate 1010. In the present example, the first electronic component 1025 also includes one or more passive components. The one or more passive components can include capacitors, inductors, and/or resistors. Although in the present example passive component is presented as a surface-mount-technology (SMT) device coupled to substrate via SMT joints, there can be other examples where passive components can be packaged or mounted differently, such as via wirebonds or bumps.

The first encapsulant 1020 is disposed on the first surface 1010a of the substrate 1010 and covers the first electronic component 1025. In the example shown in FIG. 10, the semiconductor device further includes an electromagnetic interference shielding layer 1040 enclosing the first encapsulant 1020. The EMI shielding layer 1040 may shield EMI induced to (or generated by) the semiconductor device.

The second encapsulant 1030 is formed on the second surface 1010b of the substrate 1010 to cover the second electronic component 1035 mounted on the second surface 1010b of the substrate 1010. The second encapsulant 1030 exposes the contact pads 1012b formed on the second surface 1010b of the substrate 1010 to the outside while completely covering the second electronic component 1035. The second encapsulant 1030 and the first encapsulant 1020 may be made of the same material, for example, an epoxy-based resin.

The bumps 1036 may be formed on the second surface 1010b of the substrate 1010. In a case where the semiconductor device is mounted on an external device, such as a motherboard, the bumps 1036 may be used in electrically connecting the semiconductor device to the external device.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for making a semiconductor device, comprising:

providing a package comprising:
   a substrate comprising a first surface and a second surface opposite to the first surface;
   a first electronic component mounted on the first surface of the substrate;
   a second electronic component mounted on the second surface of the substrate;
   a contact pad formed on the second surface of the substrate, wherein the contact pad is outside of a projection of the second electronic component on the second surface of the substrate; and
   a first encapsulant disposed on the first surface of the substrate and covering the first electronic component;

forming a second encapsulant over and around the second electronic component, wherein the contact pad is exposed from the second encapsulant;

planarizing the second encapsulant to expose the second electronic component; and forming a bump on the contact pad of the second surface of the substrate, wherein forming a second encapsulant over and around the second electronic component comprises:
   providing a mold having a Ω-shape, the mold comprising a chamber, an opening in fluid communication with the chamber, and a peripheral plate;
   attaching the mold onto the second surface of the substrate with the second electronic component accommodated in the chamber and the contact pad covered by the peripheral plate; and
   depositing the second encapsulant into the chamber through the opening, wherein the second encapsulant flows through the opening to cover the second electronic component and a portion of the second surface of the substrate.

2. The method of claim 1, wherein providing a package comprises:

providing the substrate, the substrate comprising a plurality of first conductive patterns on the first surface, a plurality of second conductive patterns on the second surface, and one or more conductive vias within the substrate for electrically coupling at least one of the plurality of first conductive patterns and at least one of the plurality of second conductive patterns;

attaching the first electronic component to the plurality of first conductive patterns on the first surface of the substrate;

forming the first encapsulant on the first surface of the substrate to cover the first electronic component; and attaching the second electronic component to parts of the plurality of second conductive patterns.

3. The method of claim 2, wherein providing a package further comprises:

forming an electromagnetic interference shielding layer on the first encapsulant.

4. The method of claim 1, wherein the chamber has a rectangular shape or a trapezoidal shape.

5. The method of claim 1, wherein a depth of the chamber is equal to a height of the second electronic component, and a top surface of the second electronic component contacts a top plate of the mold when the second electronic component is accommodated in the chamber.

6. The method of claim 5, wherein the mold comprises a mold film disposed between the top surface of the second electronic component and the top plate of the mold when the mold is attached to the substrate, such that the second electronic component is pressed into the mold film when the second electronic component is accommodated in the chamber.

7. The method of claim 1, wherein each of the first electronic component and the second electronic component comprises a semiconductor die or a discrete device.

8. The method of claim 1, wherein the first encapsulant and the second encapsulant comprise epoxy-based resin.

9. A method for making a semiconductor device, comprising:

providing a package comprising:
   a substrate comprising a first surface and a second surface opposite to the first surface;
   an electronic component mounted on the first surface of the substrate; and
   a contact pad formed on the first surface of the substrate, wherein the contact pad is outside of a projection of the electronic component on the first surface of the substrate;

forming an encapsulant over and around the electronic component, wherein the contact pad is exposed from the encapsulant;

planarizing the encapsulant to expose the electronic component; and forming a bump on the contact pad of the first surface of the substrate, wherein forming an encapsulant over and around the electronic component comprises:
   providing a mold having a Ω-shape, the mold comprising a chamber, an opening in fluid communication with the chamber, and a peripheral plate;
   attaching the mold onto the first surface of the substrate with the electronic component accommodated in the chamber and the contact pad covered by the peripheral plate; and
   depositing the encapsulant into the chamber through the opening, wherein the encapsulant flows through the opening to cover the electronic component and a portion of the first surface of the substrate.

* * * * *